US005567248A

United States Patent [19]
Chung

[11] Patent Number: 5,567,248
[45] Date of Patent: Oct. 22, 1996

[54] MODULAR SOLAR CELL CONTACT ARRANGEMENT

[76] Inventor: Darius Chung, 861 Haddock St., Foster City, Calif. 94404

[21] Appl. No.: 523,150

[22] Filed: Sep. 5, 1995

[51] Int. Cl.[6] ................................................ H01L 31/05
[52] U.S. Cl. .......................................... 136/244; 136/256
[58] Field of Search ..................................... 136/244, 256

[56] References Cited

U.S. PATENT DOCUMENTS

| | | | |
|---|---|---|---|
| 3,527,619 | 9/1970 | Miley | 136/244 |
| 4,481,378 | 11/1984 | Lesk | 136/244 |
| 4,487,989 | 12/1984 | Wakefield et al. | 136/256 |
| 4,540,843 | 9/1985 | Gochermann et al. | 136/251 |
| 5,131,956 | 7/1992 | Oohara et al. | 136/256 |

FOREIGN PATENT DOCUMENTS

| | | | |
|---|---|---|---|
| 61-294875 | 12/1986 | Japan | 136/244 |
| 62-105484 | 5/1987 | Japan | 136/244 |
| 63-275186 | 11/1988 | Japan | 136/244 |

*Primary Examiner*—Aaron Weisstuch

[57] ABSTRACT

A contact arrangement for permitting a plurality of solar cells to be electrically interconnected. The inventive device includes a solar cell having orthogonally oriented outer peripheral edges and oblique angled corner edges. A first pair of negative contacts is secured to a top surface of the cell proximal to a first adjacent pair of angled corner edges, and a second pair of negative contacts is secured to the cell proximal to a second adjacent pair of angled corner edges. A pair of positive contacts is secured to the top surface of the cell proximal to the second adjacent pair of angled corner edges and extends at least partially around the second pair of negative contacts. An elongated positive buss bar extends between the pair of positive contacts and along the top surface of the cell proximal to one of the outer peripheral edges. The negative contacts wrap around the respective angled corner edges and onto the top surface of the cell to permit for ease of electrically interconnecting a plurality of cells together in a series or parallel orientation.

20 Claims, 3 Drawing Sheets

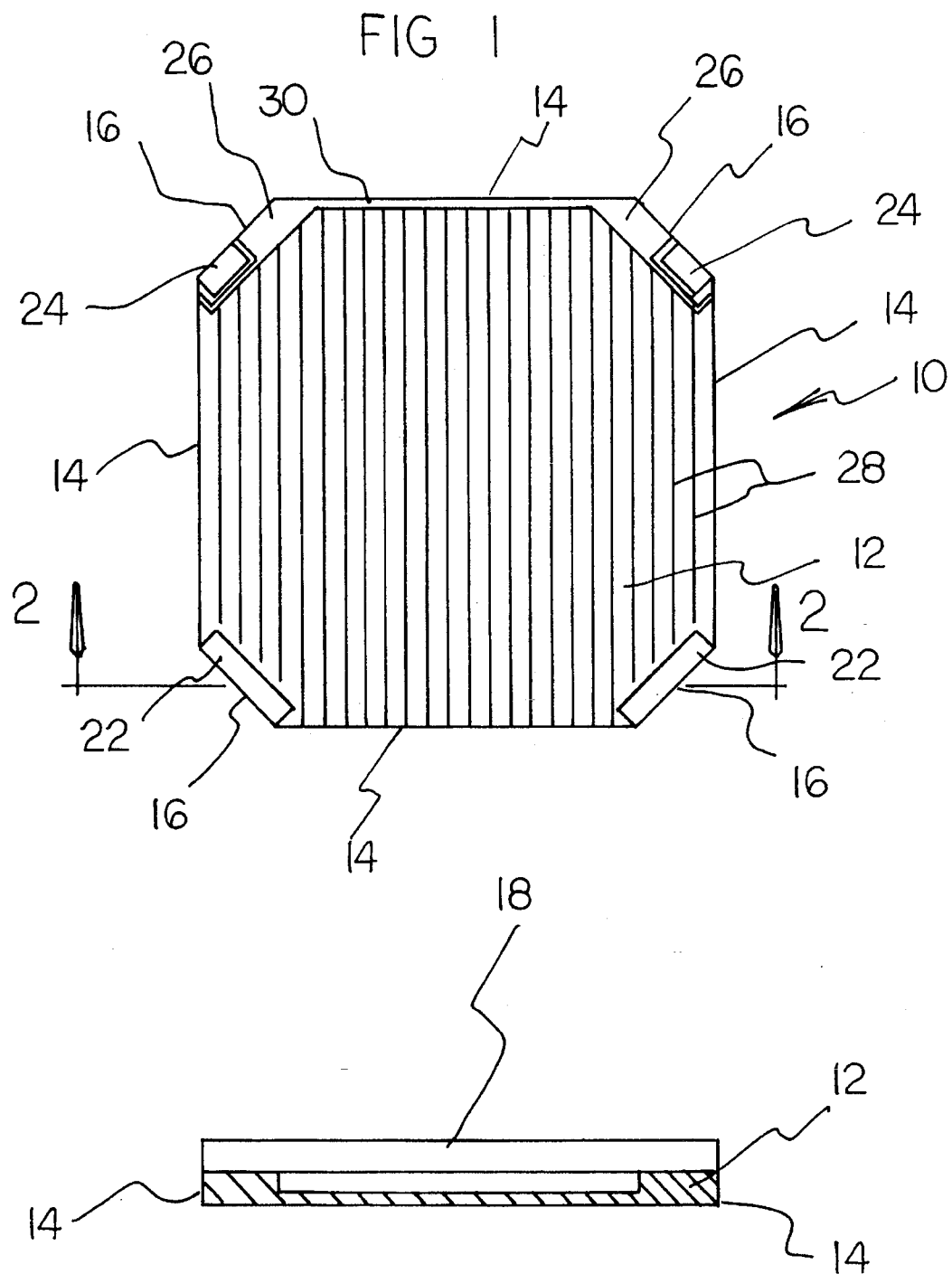

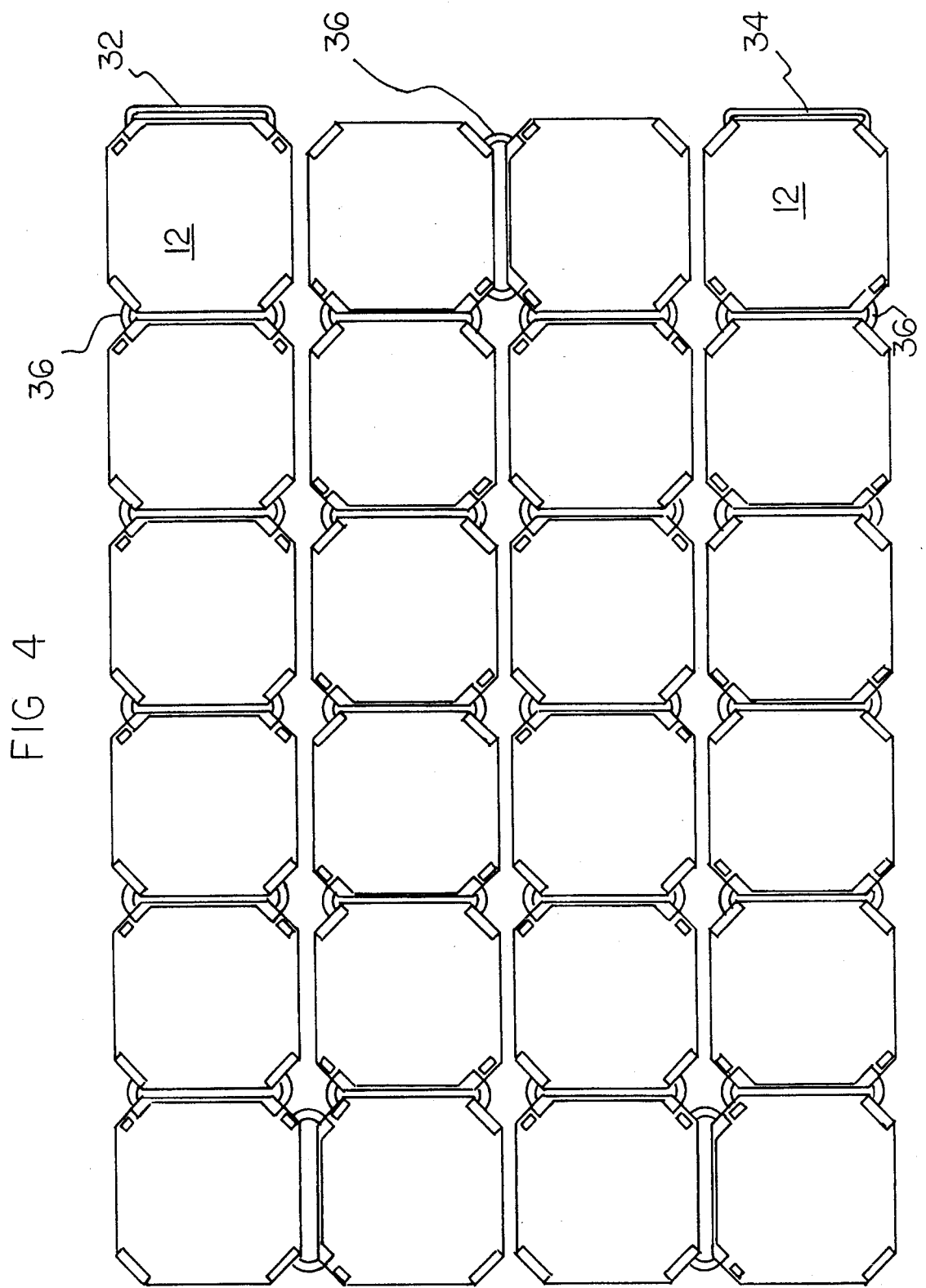

5,567,248

MODULAR SOLAR CELL CONTACT ARRANGEMENT

BACKGROUND OF THE INVENTION

1. Field of the Invention

The present invention relates to photovoltaic cell structures and more particularly pertains to a modular solar cell contact arrangement for permitting a plurality of solar cells to be electrically interconnected.

2. Description of the Prior Art

The use of photovoltaic cell structures is known in the prior art. More specifically, photovoltaic cell structures heretofore devised and utilized are known to consist basically of familiar, expected and obvious structural configurations, notwithstanding the myriad of designs encompassed by the crowded prior art which have been developed for the fulfillment of countless objectives and requirements.

Known prior art photovoltaic cell structures include U.S. Pat. No. 3,658,596; U.S. Pat. No. 5,252,141; U.S. Pat. No. 4,542,258; U.S. Pat. No. 5,185,042; U.S. Pat. No. 5,110,369; and U.S. Pat. No. 5,100,808.

While these devices fulfill their respective, particular objectives and requirements, the aforementioned patents do not disclose a modular solar cell contact arrangement for permitting a plurality of solar cells to be electrically interconnected which includes a solar cell having orthogonally oriented outer peripheral edges and oblique angled corner edges, a plurality of negative contacts secured to a top surface of the cell proximal to the angled corner edges, a pair of positive contacts secured to the top surface of the cell proximal to an adjacent pair of angled corner edges and extending at least partially around a respective pair of negative contacts, and an elongated positive buss bar extending between the pair of positive contacts and along the top surface of the cell proximal to one of the outer peripheral edges, wherein the negative contacts wrap around the respective angled corner edges and on to the top surface of the cell to permit for ease of electrically interconnecting a plurality of cells together.

In these respects, the modular solar cell contact arrangement according to the present invention substantially departs from the conventional concepts and designs of the prior art, and in so doing provides an apparatus primarily developed for the purpose of permitting a plurality of solar cells to be electrically interconnected together.

SUMMARY OF THE INVENTION

In view of the foregoing disadvantages inherent in the known types of photovoltaic cell structures now present in the prior art, the present invention provides a new modular solar cell contact arrangement construction wherein the same can be utilized for permitting ease of interconnecting of a plurality of solar cells together as well as ease of replacement of damaged cells. As such, the general purpose of the present invention, which will be described subsequently in greater detail, is to provide a new modular solar cell contact arrangement apparatus and method which has many of the advantages of the photovoltaic cell structures mentioned heretofore and many novel features that result in a modular solar cell contact arrangement which is not anticipated, rendered obvious, suggested, or even implied by any of the prior art photovoltaic cell structures, either alone or in any combination thereof.

To attain this, the present invention generally comprises a contact arrangement for permitting a plurality of solar cells to be electrically interconnected. The inventive device includes a solar cell having orthogonally oriented outer peripheral edges and oblique angled corner edges. A first pair of negative contacts is secured to a top surface of the cell proximal to a first adjacent pair of angled corner edges, and a second pair of negative contacts is secured to the cell proximal to a second adjacent pair of angled corner edges. A pair of positive contacts is secured to the top surface of the cell proximal to the second adjacent pair of angled corner edges and extends at least partially around the second pair of negative contacts. An elongated positive buss bar extends between the pair of positive contacts and along the top surface of the cell proximal to one of the outer peripheral edges. The negative contacts wrap around the respective angled corner edges and onto the top surface of the cell to permit for ease of electrically interconnecting a plurality of cells together in a series or parallel orientation.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new modular solar cell contact arrangement apparatus and method which has many of the advantages of the photovoltaic cell structures mentioned heretofore and many novel features that result in a modular solar cell contact arrangement which is not anticipated, rendered obvious, suggested, or even implied by any of the prior art tool guides, either alone or in any combination thereof.

It is another object of the present invention to provide a new modular solar cell contact arrangement which may be easily and efficiently manufactured, replaced if damaged, and marketed.

It is a further object of the present invention to provide a new modular solar cell contact arrangement which is of a durable and reliable construction.

An even further object of the present invention is to provide a new modular solar cell contact arrangement which is susceptible of a low cost of manufacture with regard to both materials and labor as well as replacement of damaged cells, and which accordingly is then susceptible of low prices of sale to the consuming public, thereby making such modular solar cell contact arrangements economically available to the buying public.

Still yet another object of the present invention is to provide a new modular solar cell contact arrangement which provides in the apparatuses and methods of the prior art some of the advantages thereof, while simultaneously overcoming some of the disadvantages normally associated therewith.

Still another object of the present invention is to provide a new modular solar cell contact arrangement for permitting a plurality of solar cells to be electrically interconnected.

Yet another object of the present invention is to provide a new modular solar cell contact arrangement which includes a solar cell having orthogonally oriented outer peripheral edges and oblique angled corner edges, a plurality of negative contacts secured to a top surface of the cell proximal to angled corner edges, a pair of positive contacts secured to the top surface of the cell proximal to an adjacent pair of angled corner edges and extending at least partially around a respective pair of negative contacts, an elongated positive buss bar extending between the pair positive contacts and along the top surface of the cell proximal to one of the outer peripheral edges, wherein the negative contacts wrap around the respective angled corner edges and on to the top surface of the cell to permit for ease of electrically interconnecting a plurality of cells together.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a top plan view of a modular solar cell contact arrangement according to the present invention.

FIG. 2 is a cross sectional view thereof.

FIG. 4 is a top plan view of a further plurality of the modular solar cells coupled together in a series orientation.

DESCRIPTION OF THE PREFERRED EMBODIMENT

Figure 3:
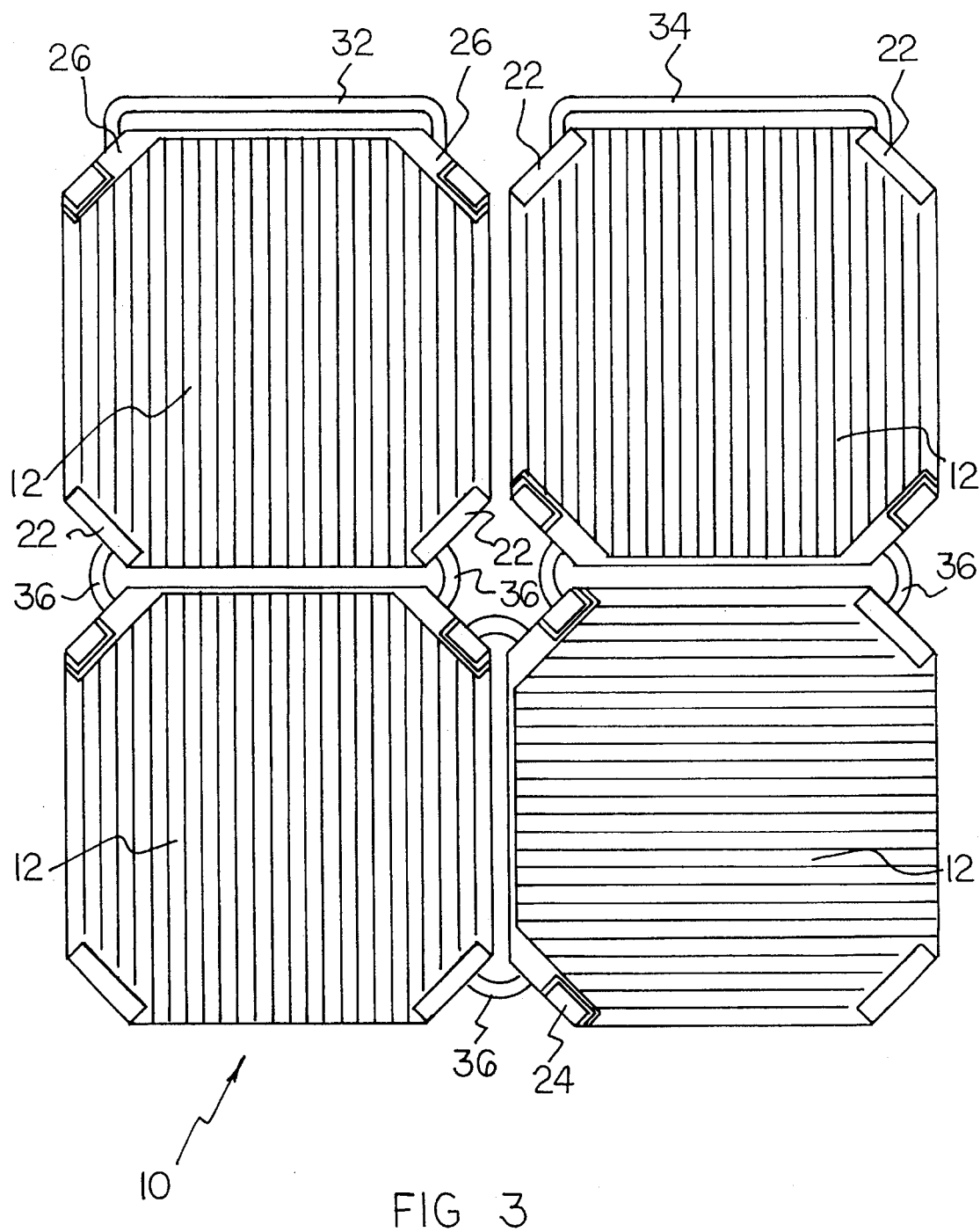
FIG. 3 is a top plan view of a plurality of the inventions connected together in a series orientation.

With reference now to the drawings, and in particular to FIGS. 1–4 thereof, a new modular solar cell contact arrangement embodying the principles and concepts of the present invention and generally designated by the reference numeral 10 will be described.

More specifically, it will be noted that the modular solar cell contact arrangement 10 comprises a solar cell 12 of conventionally known photovoltaic structure which operates to convert impinging light into an electrical current or voltage. The solar cell 12 is shaped so as to define orthogonally oriented outer peripheral edges 14 which are preferably linear and substantially equal in length. The solar cell 12 is further shaped so as to define angled corner edges 16 each extending at an oblique angle between an adjacent pair of the outer peripheral edges 14. Preferably, the outer peripheral edges 14 are substantially longer in length than the angled corner edges 16 extending therebetween, as shown in FIG. 1 of the drawings. The solar cell 12, as shown in FIG. 1, includes a cover plate 18 of substantially transparent glass or plastic material which coextensively covers an upper surface of the solar cell 12, except at the contact areas. The cover plate 18 thus defines a top surface characterized as an upper most portion of the solar cell 12.

To permit extraction of electrical energy from the solar cell 12, a first pair of negative contacts 22 are secured to the top surface of the solar cell 12 proximal to a first pair of adjacent angled corner edges 16, as shown in FIG. 1 of the drawings. Similarly, a second pair of negative contacts 24 is secured to the top surface of the solar cell 12 proximal to a second pair of the angled corner edges 16. Preferably, the first pair of negative contacts 22 extend along substantially an entire length of the first pair of angled corner edges 16, with the second pair of negative contacts 24 extending only partially along a length of the second angled corner edges 16.

Because the second pair of negative contacts 24 extend only partially along a longitudinal length of the respective second pair of angled corner edges 16 sufficient surface area remains for a pair of positive contacts 26 to be secured to the top surface of the solar cell 12 adjacent the second pair of negative contacts 24 along the second pair of angled corner edges 16. The pair of positive contacts 26 extends at least partially about the second pair of negative contacts 24 so as to electrically communicate with a plurality of grid lines 28 of the solar cell 12. Further, an elongated positive buss bar 30 is directed between the pair of positive contacts 26 along the top surface of the solar cell 12 and is electrically connected to the remainder of the plurality of grid lines 28 extending across the solar cell 12.

Preferably, the negative contacts 22 and 24 wrap around the solar cell 12, a bottom surface thereof, along the respective angled corner edges 16, and onto the top surface of the solar cell 12. By this structure, an operable negative contact 22 or 24 is available proximal to any one of the four angled corner edges 16 of the solar cell 12. Such configuration of the present invention 10 allows a plurality of the solar cells 12 to be interconnected as shown in FIGS. 3 and 4 of the drawings. To this end, the present invention 10 may further comprise a positive terminating contact 32 extending between the pair of positive contacts 26 of a first one of the solar cells 12, and a negative terminating contact 34 extending between the first pair of negative contacts 22 of a last one of the solar cells 12. A plurality of bridge conductors 36 extend between adjacent negative and positive contacts 22, 24, and 26 so as to electrically couple to the solar cells 12 together in a series or parallel orientation. By this structure, large arrays of solar cells 12 can be easily created as shown in FIG. 4 of the drawings.

In use, the modular solar cell contact arrangement 10 according to the present invention can be easily utilized in the construction of small or large arrays of solar cells 12. The specific configuration of the contacts 22, 24, and 26 permits for ease of interconnection of the plurality of cells in the arrangements illustrated in FIGS. 3 and 4.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A modular solar cell having a contact arrangement, comprising:

a solar cell having a top surface and a plurality of angled corner edges;

a first pair of negative contacts secured to the top surface of the solar cell proximal to a first adjacent pair of the angled corner edges;

a pair of positive contacts secured to the top surface of the solar cell adjacent a second adjacent pair of the angled corner edges.

2. The modular solar cell of claim 1, and further comprising a second pair of negative contacts secured to the top surface of the solar cell proximal to the second adjacent pair of the angled corner edges.

3. The modular solar cell of claim 2, wherein the first pair of negative contacts extends along substantially an entire length of the first pair of angled corner edges, with the second pair of negative contacts extending only partially along a length of the second angled corner edges.

4. The modular solar cell of claim 3 wherein the pair of positive contacts extend at least partially about the second pair of negative contacts and are positioned in electrical communication with a plurality of grid lines on the light incident surface of the solar cell.

5. The modular solar cell of claim 4, and further comprising an elongated positive buss bar secured to the top surface of the solar cell and being directed between the pair of positive contacts electrically connected to a remainder of the plurality of grid lines on the light incident surface of the solar, cell.

6. The modular solar cell of claim 5, wherein the negative contacts wrap around the edges of the solar cell, a bottom surface thereof, along the respective angled corner edges, and onto the top surface of the solar cell.

7. The modular solar cell of claim 6, and further comprising a positive terminating contact extending between the pair of positive contacts.

8. The modular solar cell of claim 6, and further comprising a negative terminating contact extending between the first pair of negative contacts of the solar cell.

9. The modular solar cell of claim 6, wherein the solar cell is shaped so as to define orthogonally oriented outer peripheral edges which are linear in configuration, the angled corner edges of the solar cell each extending at an oblique angle between an adjacent pair of the outer peripheral edges.

10. The modular solar cell of claim 9, wherein the outer peripheral edges are substantially longer in length than the angled corner edges extending therebetween.

11. The modular solar cell of claim 10, wherein the solar cell includes a cover plate of a substantially transparent material which coextensively covers an upper surface of the solar cell except at contact areas thereof, the cover plate having a top surface defining the top surface of the solar cell.

12. A modular solar cell array having a contact arrangement, comprising:

a first solar cell having a top surface and a plurality of angled corner edges; a first pair of negative contacts secured to the top surface of the solar cell proximal to a first adjacent pair of the angled corner edges; a pair of positive contacts secured to the top surface of the solar cell adjacent a second adjacent pair of the angled corner edges; a second pair of negative contacts secured to the top surface of the solar cell proximal to the second adjacent pair of the angled corner edges;

a second solar cell having a top surface and a plurality of angled corner edges; a first pair of negative contacts secured to the top surface of the solar cell proximal to a first adjacent pair of the angled corner edges; a pair of positive contacts secured to the top surface of the solar cell adjacent a second adjacent pair of the angled corner edges; a second pair of negative contacts secured to the top surface of the solar cell proximal to the second adjacent pair of the angled corner edges, the positive contacts of the second solar cell being positioned adjacent to the first pair of negative contacts of the first solar cell;

a first pair of bridge conductors extending into electrical communication between the positive contacts of the second solar cell and the first pair of negative contacts of the first solar cell.

13. The modular solar cell array of claim 12, and further comprising a third solar cell having a top surface and a plurality of angled corner edges; a first pair of negative contacts secured to the top surface of the solar cell proximal to a first adjacent pair of the angled corner edges; a pair of positive contacts secured to the top surface of the solar cell adjacent a second adjacent pair of the angled corner edges; a second pair of negative contacts secured to the top surface of the solar cell proximal to the second adjacent pair of the angled corner edges, with one of the positive contacts of the third solar cell being positioned adjacent to one of the first pair of negative contacts of the second solar cell, and another of the positive contacts of the third solar cell being positioned adjacent to one of the second pair of negative contacts of the second solar cell;

a second pair of bridge conductors, with one of the second pair of bridge conductors extending into electrical communication between the one of the positive contacts of the third solar cell and the one of the first pair of negative contacts of the second solar cell, and another of the second pair of bridge conductors extending into electrical communication between the another of the positive contacts of the third solar cell and the one of the second pair of negative contacts of the second solar cell.

14. The modular solar cell array of claim 13, wherein the negative contacts wrap around the respective solar cell edges, a bottom surface thereof, along the respective angled corner edges, and onto the top surface of the respective solar cell.

15. The modular solar cell array of claim 14, and further comprising a positive terminating contact extending between the pair of positive contacts of the first solar cell.

16. The modular solar cell array of claim 15, and further comprising a fourth solar cell having a top surface and a plurality of angled corner edges; a first pail of negative contacts secured to the top surface of the solar cell proximal to a first adjacent pair of the angled corner edges; a pair of positive contacts secured to the top surface of the solar cell adjacent a second adjacent pair of the angled corner edges; a second pair of negative contacts secured to the top surface of the solar cell proximal to the second adjacent pair of the angled corner edges, with one of the positive contacts of the fourth solar cell being positioned adjacent to one of the first pair of negative contacts of the third solar cell, and another of the positive contacts of the fourth solar cell being positioned adjacent to one of the second pair of negative contacts of the third solar cell;

a third pair of bridge conductors, with one of the third pair of bridge conductors extending into electrical communication between the one of the positive contacts of the fourth solar cell and the one of the first pair of negative contacts of the third solar cell, and another of the third pair of bridge conductors extending into electrical communication between the another of the positive contacts of the fourth solar cell and the one of the second pair of negative contacts of the third solar cell.

17. The modular solar cell array of claim 16, and further comprising a negative terminating contact extending between the first pair of negative contacts of the fourth solar cell.

18. The modular solar cell array of claim 17, wherein each of the solar cells is shaped so as to define orthogonally oriented outer peripheral edges which are linear in configuration, the angled corner edges of the solar cell each extending at an oblique angle between an adjacent pair of the outer peripheral edges.

19. The modular solar cell array of claim 18, wherein the outer peripheral edges of each of the solar cells are substantially longer in length than the angled corner edges extending therebetween.

20. The modular solar cell array of claim 19, wherein each of the solar cells includes a cover plate of a substantially transparent material which coextensively covers an upper surface of the solar cell except at contact areas thereof, the cover plate having a top surface defining the top surface of the solar cell.

* * * * *